(12) United States Patent
Mei et al.

(10) Patent No.: US 12,008,954 B2
(45) Date of Patent: Jun. 11, 2024

(54) METHOD AND SYSTEM FOR COMPRESSING DEMURA COMPENSATION VALUE

(71) Applicant: Glenfly Tech Co., Ltd., Shanghai (CN)

(72) Inventors: Ao Mei, Shanghai (CN); Chuanchuan Zhu, Shanghai (CN); Wei Wang, Shanghai (CN)

(73) Assignee: GLENFLY TECH CO., LTD., Shanghai (CN)

( * ) Notice: Subject to any disclaimer, the term of this patent is extended or adjusted under 35 U.S.C. 154(b) by 0 days.

(21) Appl. No.: 18/192,384

(22) Filed: Mar. 29, 2023

(65) Prior Publication Data

US 2024/0127749 A1 Apr. 18, 2024

(30) Foreign Application Priority Data

Oct. 14, 2022 (CN) .......................... 202211258629.7

(51) Int. Cl.
G09G 3/3208 (2016.01)
H03M 7/30 (2006.01)

(52) U.S. Cl.
CPC ........ *G09G 3/3208* (2013.01); *H03M 7/3062* (2013.01); *H03M 7/3071* (2013.01); *H03M 7/70* (2013.01); *G09G 2320/0233* (2013.01)

(58) Field of Classification Search
None
See application file for complete search history.

(56) References Cited

U.S. PATENT DOCUMENTS

| 2018/0191371 A1* | 7/2018 | Tao | H03M 7/30 |
| 2021/0287624 A1* | 9/2021 | Jiang | G06F 3/14 |
| 2022/0189387 A1* | 6/2022 | Yu | G09G 3/3208 |
| 2023/0090936 A1* | 3/2023 | Zhang | G09G 3/36 |
| | | | 345/690 |
| 2024/0013713 A1* | 1/2024 | Jacobson | G09G 3/2074 |

* cited by examiner

*Primary Examiner* — Amare Mengistu
*Assistant Examiner* — Sarvesh J Nadkarni
(74) *Attorney, Agent, or Firm* — Dority & Manning, P.A.

(57) ABSTRACT

A method for compressing Demura compensation value including: acquiring original compensation values of a target panel; inputting the original compensation values into a spatial domain sampling model, performing a down-sampling to obtain spatial domain sampling values, inputting the original compensation values into a prediction mode overall model, and performing a numerical processing to obtain a plurality of mode characteristic values; performing a data reconstruction on the spatial sampling values and the plurality of mode characteristic values to obtain a reconstructed value set; performing a syntactic encoding on the spatial sampling values and the plurality of mode characteristic values to obtain a syntactic element code set; performing a mode selection according to the reconstructed value set and the syntactic element code set to obtain an optimal prediction mode; and acquiring and outputting a syntactic element code corresponding to the optimal prediction mode to obtain a Demura compensation value compression code.

15 Claims, 4 Drawing Sheets

METHOD AND SYSTEM FOR COMPRESSING DEMURA COMPENSATION VALUE

CROSS-REFERENCE TO RELATED APPLICATION

The present application claims the priority of Chinese Patent Application No. 202211258629.7, filed on Oct. 14, 2022, entitled "Method and System for Compressing Demura Compensation Value", which is hereby incorporated by reference in its entirety.

TECHNICAL FIELD

The present application relates to the field of photoelectric display technology, and more particularly, to a method and a system for compressing Demura compensation value.

BACKGROUND

With the gradual development of visual display technologies such as virtual reality (VR), augmented reality (AR), and so on, people's demand for corresponding display technologies is gradually increasing. OLED (Organic Light-Emitting Diode) display screens are becoming more and more popular in visual display technologies such as head mounted display devices due to their advantages of fast response. But the OLED easily produces a Mura (from Japanese transliteration, denoting "speckle") phenomena due to the limitations of the fabrication processes. Mum refers to a phenomenon of unevenness display brightness or color that occurs when an OLED display screen displays the same color. For example, when the same gray scale of red is displayed on the same display screen, dark red is shown in some positions, and light red is shown in other positions. Therefore, the OLED display screen needs to be calibrated more carefully to achieve good performance.

Demura is a process eliminating Mura (nonuniform effect), and refers to generating a compensation value for each pixel in a display screen, and burning the compensation value into a read-only memory (ROM) of a panel display driving chip to compensate the gray scale of each pixel during display, thereby finally making the full screen display evenly.

SUMMARY

A method and a system for compressing Demura compensation value are provided in the present disclosure.

In a first aspect, the present disclosure provides a method for compressing Demura compensation value. The method includes acquiring original compensation values of a target panel, inputting the original compensation values into a spatial domain sampling model, performing a down-sampling to obtain spatial domain sampling values, inputting the original compensation values into a prediction mode overall model, performing a numerical processing to obtain a plurality of mode characteristic values, performing a data reconstruction on the spatial sampling values and the plurality of mode characteristic values to obtain a reconstructed value set after the data reconstruction, performing a syntactic encoding on the spatial sampling values and the plurality of mode characteristic values to obtain a syntactic element code set, performing a mode selection according to the reconstructed value set and the syntactic element code set to obtain an optimal prediction mode, and acquiring and outputting a syntactic element code corresponding to the optimal prediction mode to obtain a Demura compensation value compression code.

In one of the embodiments, the acquiring the original compensation values of the target panel includes dividing the original compensation values to obtain a plurality of original data blocks not overlapping with each other. The inputting the original compensation values into the spatial domain sampling model, performing the down-sampling to obtain the spatial domain sampling values, inputting the original compensation values into the prediction mode overall model, and performing the numerical processing to obtain the plurality of mode characteristic values include: inputting the plurality of original data blocks into the spatial domain sampling model, and performing the down-sampling to obtain the spatial domain sampling values, and inputting the plurality of original data blocks into the prediction mode overall model, and performing the numerical processing to obtain the plurality of mode characteristic values.

In one of the embodiments, the method further includes: performing a residual transformation on the plurality of mode characteristic values, respectively, to obtain a residual set, and performing a data reconstruction for the spatial sampling values, the plurality of mode characteristic values and the residual set to obtain a reconstructed value set.

In one of the embodiments, the residual transformation includes any one of a two-dimensional transformation and a three-dimensional transformation.

In one of the embodiments, the prediction mode overall model includes a plurality of prediction mode sub-models, and the plurality of prediction mode sub-models include a mean value prediction sub-model, a moving average prediction sub-model, a knot prediction sub-model, a cluster sub-model, a linear difference sub-model, a quadratic interpolation sub-model, and a multi-data mode fitting sub-model. The inputting the original compensation values into the prediction mode overall model and performing the numerical processing to obtain the plurality of mode characteristic values include: inputting the original compensation values to each of the prediction mode sub-models, and performing the numerical processing to obtain the plurality of mode characteristic values having a one-to-one relationship with the prediction mode sub-models.

In one of the embodiments, the performing the mode selection according to the reconstructed value set and the syntactic element code set to obtain the optimal prediction mode includes: performing the mode selection according to the reconstructed value set and the syntactic element code set to obtain preferred prediction modes and preferred syntactic element codes corresponding to the preferred prediction modes, and performing a code rate judgment on the preferred syntactic element codes in sequence to obtain the optimal prediction mode.

In one of the embodiments, the syntactic element code is configured to represent a residual transformation mode and an interpolation type.

In one of the embodiments, the performing the code rate judgment on the preferred syntactic element codes in sequence to obtain the optimal prediction mode incudes: selecting a syntactic element code from the preferred syntactic element codes according to code rates in a descending order and using the selected syntactic element code as a current syntactic element code, and using a prediction mode corresponding to the current syntactic element code as the optimal prediction mode, if a bit number of the current syntactic element code does not exceed a preset bit number.

In one of the embodiments, the method further includes abandoning the current syntactic element code, if the bit number of the current syntactic element code exceeds the preset bit number; and selecting a next syntactic element code according to the descending order of the code rates to perform the code rate judgment until the optimal prediction mode is obtained.

In a second aspect, the present disclosure also provides a system for compressing Demura compensation value. The system includes a data acquiring module, a spatial sampling module, a prediction mode module, a data reconstructing module, a syntactic element coding module, an optimal prediction mode selecting module, and a compensation value compression code outputting module.

The data acquiring module is configured to acquire original compensation values of a target panel.

The spatial sampling module is configured to input the original compensation values into a spatial domain sampling model and perform a down-sampling to obtain spatial domain sampling values.

The prediction mode module is configured to input the original compensation values into a prediction mode overall model and perform a numerical processing to obtain a plurality of mode characteristic values.

A data reconstructing module is configured to perform a data reconstruction on the spatial sampling values and the plurality of mode characteristic values to obtain a reconstructed value set after the data reconstruction.

A syntactic element coding module is configured to perform a syntactic encoding on the spatial sampling values and the plurality of mode characteristic values to obtain a syntactic element code set.

The optimal prediction mode selecting module is configured to perform a mode selection according to the reconstructed value set and the syntactic element code set to obtain an optimal prediction mode.

The compensation value compression code outputting module is configured to acquire and output a syntactic element code corresponding to the optimal prediction mode to obtain a Demura compensation value compression code.

In a third aspect, the present disclosure also provides a computer apparatus. The computer apparatus includes a memory having a computer program stored therein, and a processor. The processor, when executing the computer program, performs the steps of any method for compressing the Demura compensation value above.

In a fourth aspect, the present disclosure also provides a non-transitory computer readable storage medium, and a computer program is stored on the non-transitory computer readable storage medium. The computer program, when executed by a processor, performs the steps of any method for compressing the Demura compensation value above.

In a fifth aspect, the present disclosure also provides a computer program product including a computer program. The computer program, when executed by a processor, performs the steps of any method for compressing the Demura compensation value above.

In the method and the system for compressing Demura compensation value, the original compensation values of the target panel are acquired: the original compensation values are inputted into the spatial domain sampling model, and the down-sampling is performed to obtain the spatial domain sampling values; the original compensation values are inputted into the prediction mode overall model to perform the numerical processing to obtain the plurality of mode characteristic values; the data reconstruction is performed on the spatial sampling values and the plurality of mode characteristic values to obtain a reconstructed value set after the data reconstruction: the syntactic encoding is performed on the spatial sampling values and the plurality of mode characteristic values to obtain the syntactic element code set; the mode selection is performed according to the reconstructed value set and the syntactic element code set to obtain the optimal prediction mode; and the syntactic element code corresponding to the optimal prediction mode is acquired and outputted to obtain the Demura compensation value compression code. According to the present disclosure, the optimal prediction mode may be selected from the plurality of prediction modes to compress the compensation values according to the data characteristics of the compensation values of each panel. The optimal prediction mode may be adapted to the data characteristics of the Demura compensation values of different panels, and may compress efficiently in accordance with the specific panels and improve the generalization performance of the model.

BRIEF DESCRIPTION OF THE DRAWINGS

FIG. 3 (b) is a block diagram showing the structure of the system for compressing Demura compensation value according to another embodiment.

DETAILED DESCRIPTION OF THE EMBODIMENTS

In order to make the objectives, technical solutions and advantages of the present disclosure clearer and to be better understood, the present disclosure is further described in detail below in combination with the drawings and embodiments. It should be understood that the specific embodiments described herein are only used to explain the present disclosure, rather than limit the present disclosure.

In order to save the ROM resources and reduce a chip cost, the compensation values are generally compressed, and the compressed binary bit stream is burned to the ROM. Currently, the compensation values are compressed mostly by a spatial compression algorithm or a statistical-based Huffman coding. However, as data characteristics of the Demura compensation values of different panels are different, the compression methods in the related art cannot achieve an efficient compression pertinently for the characteristics of different panels.

Figure 1:
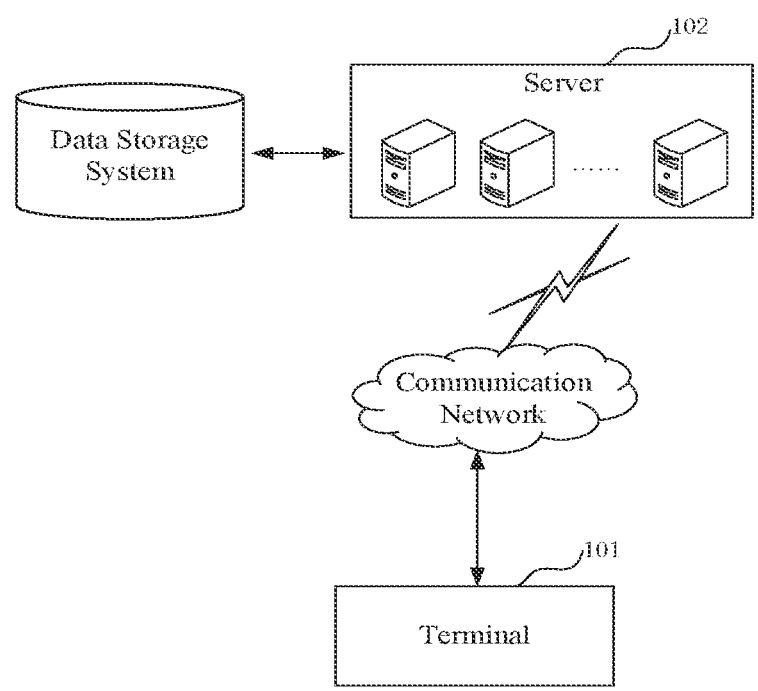
FIG. 1 is an application environment diagram of a method for compressing Demura compensation value according to an embodiment.

The method for compressing Demura compensation value provided by the embodiments of the present disclosure may be applied in the application environment shown in FIG. 1. The terminal 101 communicates with the server 102 through a communication network. A data storage system may store data that the server 102 needs to process. The data storage system may be integrated on the server 102, or may be provided on a cloud or other network servers. The terminal 101 may represent any OLED panel device. The server 102 may be implemented by a separate server, or by a server cluster composed by a plurality of servers.

Figure 2:
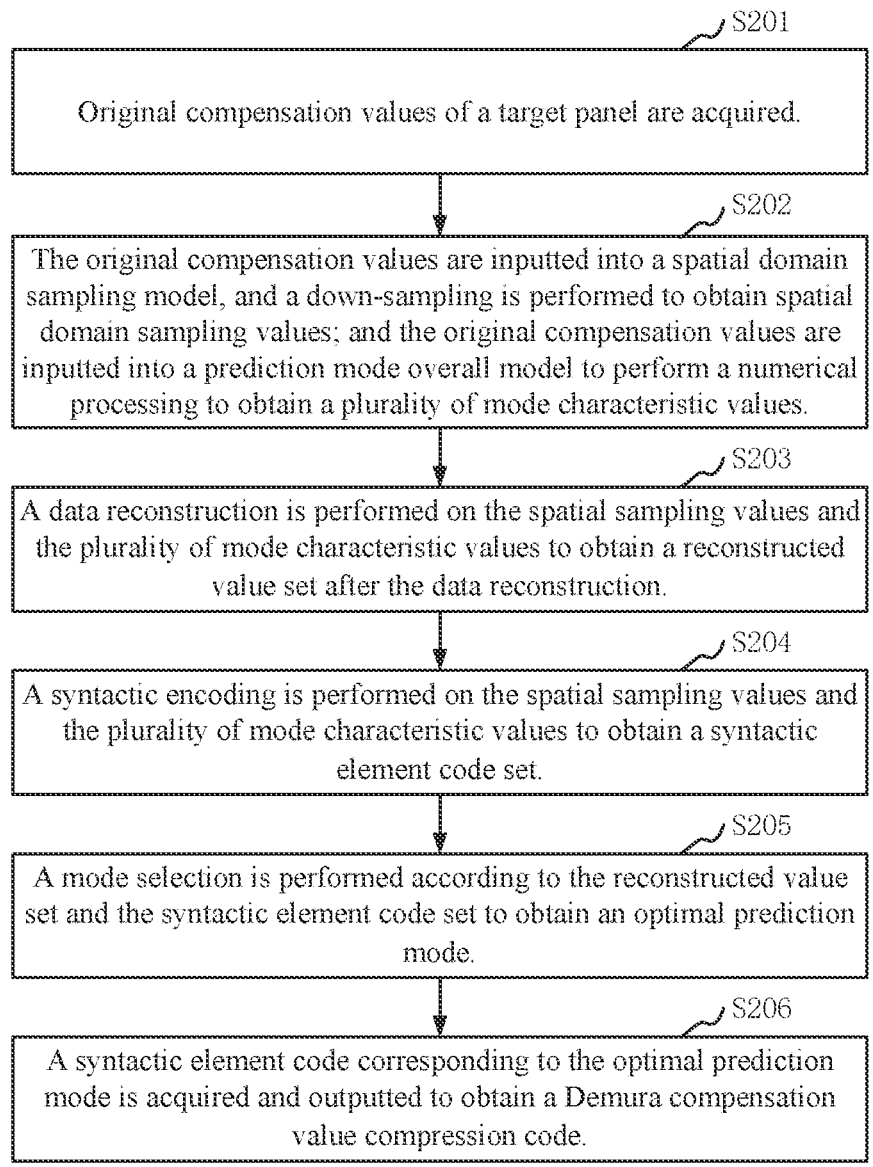
FIG. 2 is a schematic flow chart of the method for compressing Demura compensation value according to an embodiment.

In an embodiment, as shown in FIG. 2, a method for compressing Demura compensation value is provided. The method, described by taking the method applied to the server 102 in FIG. 1 as an example, includes the following steps S201 to S206.

In step S201, original compensation values of a target panel are acquired.

The target panel refers to a current OLED panel to be processed. Mura effects of different OLED panels are different. Some Mura effects are caused by nonuniform color mixing, some Mura effects are caused by nonuniform light and dark, and some Mura effects are caused by a Moire pattern. Demura is a process eliminating Mura (nonuniform effect), and refers to generating a compensation value for each pixel in a display screen and burning the compensation value to a read-only memory (ROM) of a panel display driving chip. Since the Mura effect on each OLED panel is random, the original compensation values generated by the Demura are also different.

Specifically, the original compensation value of each pixel in the target panel is first generated by the Demura process. Since a size of the target panel is relatively large, the original compensation values require a relatively large memory space. Taking a panel having a pixel size of 2560×1600 as an example, compensation values of three gray scales need to be stored, and each of the compensation values has six bits, so a total ROM resource of 221.184 Mb is required to store compensation values for three channels of RGB. In order to save storage resources, the original compensation values need to be compressed for storage.

In step S202, the original compensation values are inputted into a spatial domain sampling model, and a down-sampling is performed to obtain spatial domain sampling values; and the original compensation values are inputted into a prediction mode overall model to perform a numerical processing to obtain a plurality of mode characteristic values.

The spatial domain refers to a pixel domain. Generally, an image compression includes two parts: down-sampling and encoding. The spatial domain sampling model refers to an algorithm or a model for performing the down-sampling processing at a pixel level. The prediction mode overall model refers to a model of predicting original compensation values by using a numerical coding method. The prediction mode overall model may include a plurality of prediction mode sub-models, such as a mean value prediction sub-model, a moving average prediction sub-model, a knot prediction sub-model, a cluster sub-model, a linear interpolation sub-model, a quadratic interpolation sub-model, and a multi-data mode fitting sub-model, etc.

Specifically, the original compensation values of the target panel are inputted into the spatial domain sampling model to perform the down-sampling to obtain the spatial sampling values. For example, a down-sampling is performed on the compensation values for pixels in one panel by twice in the horizontal direction and the vertical direction, which can realize a compression for the original compensation values by four times, and this step is used for a dimensionality reduction processing on the original compensation values to reduce redundant data. At the same time, the original compensation values are inputted into the prediction mode overall model, so that an encoding processing is performed on the original compensation values and each of the preset prediction mode sub-models to obtain mode characteristic values corresponding to each prediction mode sub-model. In order to predict which prediction mode sub-model obtains a good compression effect, it is necessary to evaluate a final compression effect of each prediction mode sub-model. For example, indexes such as a relatively small storage space required after compression, a rapid compression speed, or a better Demura effect of decoding recovery after compression may serve as indexes to evaluate the compression effect.

In step S203, a data reconstruction is performed on the spatial sampling values and the plurality of mode characteristic values to obtain a reconstructed value set after the data reconstruction.

The data reconstruction refers to a reconstruction performed on the spatial sampling values and the plurality of mode characteristic values outputted from the prediction mode overall model to obtain reconstructed values corresponding to various prediction mode sub-models, and all the reconstructed values are combined as the reconstructed value set.

In step S204, a syntactic encoding is performed on the spatial sampling values and the plurality of mode characteristic values to obtain a syntactic element code set.

The syntactic element refers to information, such as a prediction mode sub-model, residual information, and the like, which is required for a decoder to reconstruct the Demura compensation values.

Specifically, the syntactic encoding is performed on the spatial sampling values and the various mode characteristic values, respectively, to obtain prediction element codes for each of the various prediction modes, and the prediction element codes constitute the syntactic element code set.

In step S205, a mode selection is performed according to the reconstructed value set and the syntactic element code set to obtain an optimal prediction mode.

The optimal prediction mode refers to a prediction mode sub-model having the best compression effect. The final compression effect of each prediction mode sub-model is evaluated by the mode selection. For example, the indexes such as the relatively small storage space required after compression, the rapid compression speed, or the better Demura effect of decoding recovery after compression may serve as indexes to evaluate the compression effect.

Specifically, the optimal prediction mode is selected according to the reconstructed values corresponding to the plurality of prediction mode sub-models and the corresponding syntactic element codes.

In step S206, a syntactic element code corresponding to the optimal prediction mode is acquired and outputted to obtain a Demura compensation value compression code.

Specifically, the reconstruction is performed on the spatial sampling values by each prediction mode sub-model to obtain a corresponding reconstructed value, and the syntactic coding is performed on the spatial sampling values and the plurality of mode characteristic values to obtain the syntactic element code set, therefore the syntactic element code corresponding to the predicted optimal prediction mode may be obtained to serve as the final Demura compensation value compression code, and the Demura compensation value compression code is outputted and stored in the ROM corresponding to the target panel.

According to the embodiments above, the optimal prediction mode may be selected from the plurality of prediction modes to compress the compensation values according to the data characteristics of the compensation values of each panel. The optimal prediction mode may be adapted to the data characteristics of the Demura compensation values of different panels, and may compress efficiently in accordance with the specific panels and improve the generalization performance of the model.

In an embodiment, the step S201 includes dividing the original compensation values to obtain a plurality of original data blocks not overlapping with each other. The step S202 includes inputting the plurality of original data blocks into the spatial domain sampling model, and performing the down-sampling to obtain the spatial domain sampling values; and inputting the plurality of original data blocks into the prediction mode overall model to perform a numerical processing to obtain the plurality of mode characteristic values.

Specifically, the original compensation values of the entire target panel are divided into data blocks according to a predetermined block size, and then the down-sampling is performed on each of the data blocks sequentially by means of the spatial domain sampling model to obtain the spatial sampling values of each data block. At the same time, each of the original data blocks is inputted into the prediction mode overall model in sequence to perform the numerical processing to obtain the plurality of mode characteristic values of each data block. Subsequently, a selection is performed among the predicted results of modes for the current data block, to obtain the optimal prediction mode most suitable for the current data block, and the syntactic element codes corresponding to the optimal prediction mode is used as the Demura compensation value compression code of the current data block.

In the embodiments above, the data division is performed on the entire target panel to obtain the plurality of original data blocks, which is beneficial to a subsequently spatial sampling and a mode selection for each data block to obtain an encoding mode that is most suitable for the data blocks, respectively. Different compression encoding modes may be used according to the characteristics of each data block on the entire target panel, which is beneficial to the acquirement of the optimal compression compensation value and saves the storage resources.

In an embodiment, after the step S202, the method further includes performing a residual transformation on the plurality of mode characteristic values, respectively, to obtain a residual set: and performing a data reconstruction for the spatial sampling values, the plurality of mode characteristic values and the residual set, to obtain the reconstructed value set.

The residual refers to a difference between an actual observed value and an estimated value (a predicted value) in the mathematical statistics. In the present disclosure, the residual transformation refers to calculating a residual of each mode characteristic value generated by the prediction mode overall model.

Specifically, the residual generated by each prediction mode sub-model is calculated, and the data reconstruction is performed for the spatial sampling values, each mode characteristic value and the residual of each mode characteristic value to obtain the reconstructed value set.

In the embodiment above, the residuals generated by the prediction mode sub-models are calculated so that a subsequently comparison is performed according to the residuals to obtain the optimal prediction mode.

In an embodiment, the residual transformation above includes any one of a two-dimensional transformation and a three-dimensional transformation.

In an embodiment, the prediction mode overall model includes a plurality of prediction mode sub-models, which include a mean value prediction sub-model, a moving average prediction sub-model, a knot prediction sub-model, a cluster sub-model, a linear difference sub-model, a quadratic interpolation sub-model, and a multi-data mode fitting sub-model. The step S202 includes inputting the original compensation values to each of the prediction mode sub-models and performing the numerical processing, so as to obtain the mode characteristic values having a one-to-one relationship with the prediction mode sub-models.

Specifically, the prediction mode overall model predicts by means of the plurality of prediction modes including the mean value prediction, the moving average prediction, the knot prediction, the cluster prediction, the linear interpolation prediction, the quadratic interpolation prediction, and the multi-data mode fitting prediction. In the present embodiment, the original compensation values are predicted by each of the prediction modes above, respectively, to obtain different mode characteristic values.

In the embodiments above, the original compensation values are encoded and reconstructed by means of the plurality of prediction modes to provide the data basis for the subsequent mode selection.

In an embodiment, the step S205 includes performing a mode selection according to the reconstructed value set and the syntactic element code set, to obtain preferred prediction modes and preferred syntactic element codes corresponding to the preferred prediction modes; and performing a code rate judgment on the preferred syntactic element codes in sequence to obtain the optimal prediction mode.

Where the syntactic element refers to the information, such as the prediction mode sub-model, the residual information, and the like, which is required for the decoder to reconstruct the Demura compensation values. The following table 1 shows part of the syntactic elements of one prediction mode of an embodiment of the present disclosure.

TABLE 1

Table of Part Of Syntactic Element

| | Descriptor |
|---|---|
| one_block_prdxform_core ( ) { | |
| prd_mode (prediction mode) | fu(1) |
| xform_mode (transformation mode) | fu(1) |
| knot_skip_flag (knot skip flag bit) | fu(1) |
| knotSkip[MAX_KNOT_NUM]={0} | |
| if(knot_skip_flag){ | |
| curve_fit_type (curve fitting type) | fu(1) |
| knotSkip[skip_knot_idx[curve_fit_type]] = 1 | |
| } | |

In Table 1, fu(1) indicates that the corresponding syntactic element has a fixed-length code with a length of one bit. Prd_mode denotes a prediction mode of the current data block. In the compressing method of the present disclosure, prediction modes are classified into seven types. The syntactic elements listed in Table 1 contain two kinds of prediction modes in total, therefore the code prd_mode requires one bit. Xform_mode denotes a transformation mode of prediction residual of a data block, and the transformation modes used in the compressing method of the present disclosure include a two-dimensional transformation and a three-dimensional transformation. Knot_skip_flag indicates whether the data block is compressed by skipping a knot or not, and the skipped knot is obtained by interpolating the non-skipped knots. Curve_fit_type denotes an interpolation type. The interpolating modes of the compressing method of the present disclosure include a linear and a non-linear interpolating modes. Skip_knot_idx denotes an array with a length of two, and indicates which knot the corresponding interpolation type should skip. MAX_KNOT_NUM is a constant whose value is three in the compressing method of the present disclosure. The compressing method encodes the syntactic elements according to a predetermined form to obtain a binary bit stream, and the decoding system reads the binary bit stream and decodes the values of the syntactic elements in the same way to reconstruct the Demura compensation value.

Specifically, a mode selection is performed according to the reconstructed value set and the syntactic element code set to obtain the preferred prediction mode. There is one or more preferred prediction modes. Accordingly, preferred syntactic element codes corresponding to each of the preferred prediction modes may be obtained. A code rate judgment is performed on the reconstructed values or the syntactic element codes corresponding to each of the preferred prediction modes, and it is judged whether a reconstructed value has the optimal bit number, namely the reconstructed value that saves the storage space most. If yes, the prediction mode corresponding to the reconstructed value is used as the optimal prediction mode.

In some embodiments, a syntactic element code is selected from the preferred syntactic element codes according to code rates in a descending order, and is used as the current syntactic element code. If the bit number of the current syntactic element code do not exceed a preset bit number, the prediction mode corresponding to the current syntactic element code is used as the optimal prediction mode.

If the bit number of the current syntactic element code exceeds the preset bit number, the current syntactic element code is abandoned, and a next syntactic element code is selected according to the descending order of code rates so that the code rate judgment is performed until the optimal prediction mode is obtained.

According to the embodiments above, the optimal prediction mode is obtained through the mode selection, which may limit the length of the final compressed value within the preset bit number, thereby further achieving the efficient compression and saving the storage space.

It should be understood that although the steps in the flow charts involved in the embodiments described above are shown in sequence as indicated by the arrows, these steps are not necessarily performed in sequence as indicated by the arrows. Unless expressly stated herein, these steps are not performed in a strict order and may be performed in other orders. Moreover, at least a portion of the steps in the flowcharts referred to in the embodiments described above may include a plurality of sub-steps or phases, which are not necessarily performed at the same time, but may be performed at different times, and the execution order of the steps or phases is not necessarily performed in sequence, but may be performed in turn or alternately with at least a portion of other steps or the sub-steps or phases of other steps.

Based on the same concept, the embodiments of the present disclosure also provide a system for compressing Demura compensation value to implement the method for compressing Demura compensation value above. The implementation of the solutions provided by the system is similar to that described in the above method. Therefore, the specific limitations of one or more embodiments of the system for compressing Demura compensation value provided hereinafter may be found in the above limitations on the method for compressing Demura compensation value, and they will not be described herein again.

Figure 3:
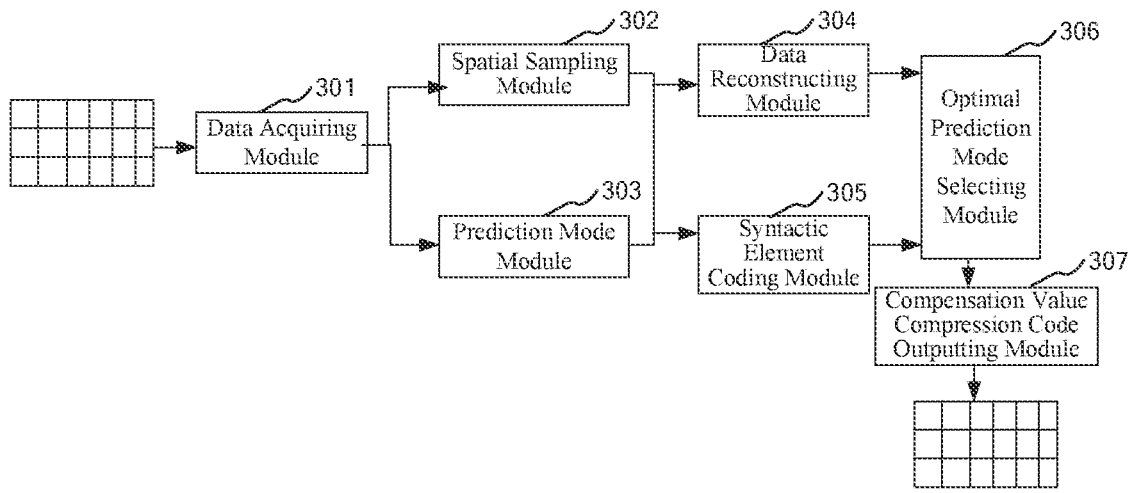
FIG. 3 (a) is a block diagram showing a structure of a system for compressing Demura compensation value according to an embodiment.
Figure 3:
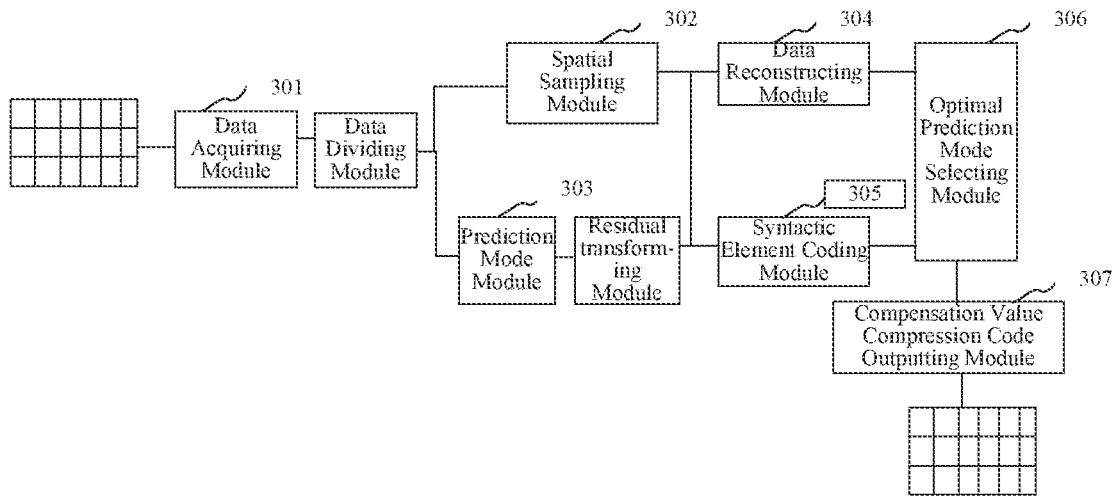

In an embodiment, as shown in FIG. 3 (a), the present disclosure provides a system for compressing Demura compensation value 300 including a data acquiring module 301, a spatial sampling module 302, a prediction mode module 303, a data reconstructing module 304, a syntactic element coding module 305, an optimal prediction mode selecting module 306, and a compensation value compression code outputting module 307.

The data acquiring module 301 is configured to acquire original compensation values of a target panel.

The spatial sampling module 302 is configured to input the original compensation values into a spatial domain sampling model and perform a down-sampling to obtain spatial domain sampling values.

The prediction mode module 303 is configured to input the original compensation values into a prediction mode overall model to perform a numerical processing to obtain a plurality of mode characteristic values.

The data reconstructing module 304 is configured to perform a data reconstruction on the spatial sampling values and the plurality of mode characteristic values to obtain a reconstructed value set after the data reconstruction.

The syntactic element coding module 305 is configured to perform a syntactic encoding on the spatial sampling values and the plurality of mode characteristic values to obtain a syntactic element code set.

The optimal prediction mode selecting module 306 is configured to perform a mode selection according to the reconstructed value set and the syntactic element code set to obtain an optimal prediction mode.

The compensation value compression code outputting module 307 is configured to acquire and output a syntactic element code corresponding to the optimal prediction mode to obtain a Demura compensation value compression code.

In an embodiment, as shown in FIG. 3 (b), FIG. 3 (b) shows a block diagram showing the structure of the system for compressing Demura compensation value according to another embodiment. The system for compressing Demura compensation value 300 further includes a data dividing module, configured to divide the original compensation values to obtain a plurality of original data blocks not overlapping with each other. The spatial sampling module 302 is further configured to input the plurality of original data blocks into the spatial domain sampling model, perform the down-sampling to obtain the spatial domain sampling values, and input the plurality of original data blocks into the prediction mode overall model to perform a numerical processing to obtain the plurality of mode characteristic values.

In an embodiment, the system for compressing Demura compensation value 300 further includes: a residual transforming module, configured to perform a residual transformation on the plurality of mode characteristic values, respectively, to obtain a residual set: and the data reconstructing module 304, further configured to perform a data reconstruction for the spatial sampling values, the plurality of mode characteristic values and the residual set, to obtain the reconstructed value set.

In an embodiment, the residual transformation above includes any one of a two-dimensional transformation and a three-dimensional transformation.

In an embodiment, the prediction mode overall model includes a plurality of prediction mode sub-models, which include a mean value prediction sub-model, a moving average prediction sub-model, a knot prediction sub-model, a cluster sub-model, a linear difference sub-model, a quadratic interpolation sub-model, and a multi-data mode fitting sub-model. The prediction mode module 303 is further configured to input the original compensation values to each of the prediction mode sub-models to perform the numerical processing, so as to obtain the mode characteristic values having a one-to-one relationship with the prediction mode sub-models.

In an embodiment, the optimal prediction mode selecting module 306 is further configured to perform a mode selection according to the reconstructed value set and the syntactic element code set to obtain preferred prediction modes and preferred syntactic element codes corresponding to the preferred prediction modes, and perform a code rate judgment on the preferred syntactic element codes in sequence to obtain the optimal prediction mode.

In an embodiment, the syntactic element code is configured to represent a residual transformation mode and an interpolation type.

In an embodiment, the system for compressing Demura compensation value 300 further includes a code rate control module, configured to select a syntactic element code from the preferred syntactic element codes according to code rates in a descending order and use the selected syntactic element code as a current syntactic element code, and if a bit number of the current syntactic element code does not exceed a preset bit number, use the prediction mode corresponding to the current syntactic element code as the optimal prediction mode.

In an embodiment, the code rate control module is further configured to, if the bit number of the current syntactic element code exceeds the preset bit number, abandon the current syntactic element code, and select a next syntactic element code according to the descending order of code rates so that the code rate judgment is performed until the optimal prediction mode is obtained.

Each module in the system for compressing Demura compensation value above may be implemented in whole or in part by software, hardware and combinations thereof. The modules may be embedded in or independent of a processor of a computer apparatus in a way of hardware, or may be stored in a memory of a computer apparatus in a way of software to make it easy for the processor to call and perform operations corresponding to the modules.

It should be noted that user information (including, but not limited to, user equipment information, user personal information, and the like) and data (including, but not limited to, data for analysis, stored data, displayed data, and the like) related to the present disclosure are information and data that are authorized by the user or sufficiently authorized by each party.

Figure 4:
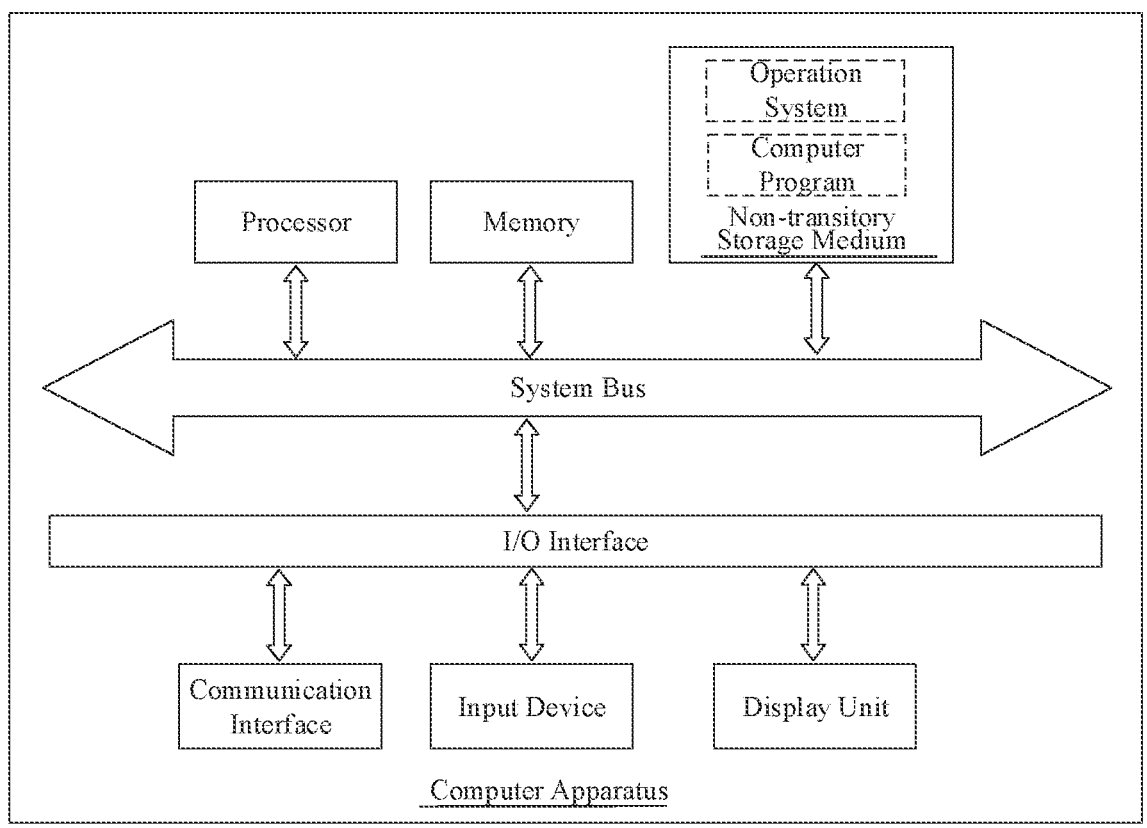
FIG. 4 is a view showing an internal structure of a computer apparatus according to an embodiment.

In one of the embodiments, a computer apparatus is provided. The computer apparatus may be a terminal, the internal structure of which is shown in FIG. 4. The computer apparatus includes a processor, a memory, a communication interface, a display screen, and an input device which are connected by a system bus. The processor of the computer apparatus is configured to provide computing and control capabilities. The memory of the computer apparatus includes a non-transitory storage medium and a memory. The non-transitory storage medium stores an operating system and a computer program. The memory provides an environment for the operation of an operating system and a computer program in a non-transitory storage medium. The communication interface of the computer apparatus is used for wire or wireless communication with external terminals, and the wireless communication may be implemented by WIFI, mobile cellular network, NFC (near field communication) or other technologies. The computer program, when executed by the processor, performs the method for compressing Demura compensation value. The display screen of the computer apparatus may be a liquid crystal display screen or an electronic ink display screen, and the input device of the computer apparatus may be a touch layer covered on the display screen, or may be a key, a trackball or a touch pad provided on the housing of the computer apparatus, or may be an external keyboard, a touch pad or a mouse.

It should be understood by those skilled in the art that the structure shown in FIG. 4 is a block diagram showing only part of the structure associated with the solutions of the present disclosure, but not intended to limit the computer apparatus to which the solutions of the present disclosure are applied, and that the particular computer apparatus may include more or less components than those shown in the figure, or may combine with certain components, or may have different component arrangements.

In one of the embodiments, a computer apparatus is provided. The computer apparatus includes a memory having a computer program stored therein, and a processor. The processor, when executing the computer program, performs the steps of any method for compressing the Demura compensation value above.

In one of the embodiments, a non-transitory computer readable storage medium is provided, and a computer program is stored on the non-transitory computer readable storage medium. The computer program, when executed by a processor, performs the steps of any method for compressing the Demura compensation value above.

In one of the embodiments, a computer program product is provided and includes a computer program. The computer program, when executed by a processor, performs the steps of any method for compressing the Demura compensation value above.

A person of ordinary skill in the art may understand that all or part of the processes in the methods of the above embodiments may be achieved by the relevant hardware instructed by the computer programs. The computer programs may be stored in a non-transitory computer readable storage medium, and when being executed, perform the processes such as those of the methods of the embodiments described above. The memory, database, or other medium recited in the embodiments of the disclosure include at least one of non-transitory and transitory memory. Non-transitory memory includes read-only memory (ROM), magnetic tape, floppy disk, flash memory, optical memory, high density embedded non-transitory memory, resistive random access memory (ReRAM), magnetoresistive random access memory (MRAM), ferroelectric random access memory (FRAM), phase change memory (PCM), or graphene memory, etc. Transitory memory includes random access memory (RAM) or external cache memory, etc. For illustration rather than limitation, RAM may be in various forms, such as static random access memory (SRAM) or dynamic random access memory (DRAM), etc. The databases involved in the embodiments of the present disclosure may include at least one of a relational database and a non-relational database. The non-relational databases may include, but are not limited to, a block chain-based distributed database, etc. The processors involved in the embodiments of the present disclosure may be but are not limited to general purpose processors, central processing units, graphics processors, digital signal processors, programmable logicians, quantum computing-based data processing logicians, etc.

The technical features of the foregoing embodiments may be arbitrarily combined. For brevity, not all possible combinations of the technical features in the foregoing embodiments are described. However, the combinations of these technical features should be considered to be included within the scope of the present disclosure, as long as the combinations are not contradictory.

The above described embodiments are several implementations of the present disclosure, and the description thereof is specific and detailed, but cannot be construed as a limitation to the scope of the present disclosure. It should be noted that for a person of ordinary skill in the art, various modifications and improvements may be made without departing from the concept of the present disclosure, and all these modifications and improvements are all within the protection scope of the present disclosure. Therefore, the protection scope of the present disclosure shall be subject to the attached claims.

What is claimed is:

1. A method for compressing Demura compensation value, comprising:
    acquiring original compensation values of a target panel;
    inputting the original compensation values into a spatial domain sampling model, performing a down-sampling to obtain spatial domain sampling values, inputting the original compensation values into a prediction mode overall model, and performing a numerical processing to obtain a plurality of mode characteristic values;
    performing a data reconstruction on the spatial sampling values and the plurality of mode characteristic values to obtain a reconstructed value set after the data reconstruction;
    performing a syntactic encoding on the spatial sampling values and the plurality of mode characteristic values to obtain a syntactic element code set;
    performing a mode selection according to the reconstructed value set and the syntactic element code set to obtain an optimal prediction mode; and
    acquiring and outputting a syntactic element code corresponding to the optimal prediction mode to obtain a Demura compensation value compression code.

2. The method of claim 1, wherein:
    the acquiring the original compensation values of the target panel comprises dividing the original compensation values to obtain a plurality of original data blocks not overlapping with each other; and
    the inputting the original compensation values into the spatial domain sampling model, performing the down-sampling to obtain the spatial domain sampling values, inputting the original compensation values into the prediction mode overall model, and performing the numerical processing to obtain the plurality of mode characteristic values comprise:
        inputting the plurality of original data blocks into the spatial domain sampling model, and performing the down-sampling to obtain the spatial domain sampling values; and
        inputting the plurality of original data blocks into the prediction mode overall model, and performing the numerical processing to obtain the plurality of mode characteristic values.

3. The method of claim 1, further comprising:
    performing a residual transformation on the plurality of mode characteristic values, respectively, to obtain a residual set; and
    performing a data reconstruction for the spatial sampling values, the plurality of mode characteristic values and the residual set to obtain a reconstructed value set.

4. The method of claim 3, wherein the residual transformation comprises any one of a two-dimensional transformation and a three-dimensional transformation.

5. The method of claim 1, wherein:
    the prediction mode overall model comprises a plurality of prediction mode sub-models, and the plurality of prediction mode sub-models comprise a mean value prediction sub-model, a moving average prediction sub-model, a knot prediction sub-model, a cluster sub-model, a linear difference sub-model, a quadratic interpolation sub-model, and a multi-data mode fitting sub-model;
    the inputting the original compensation values into the prediction mode overall model and performing the numerical processing to obtain the plurality of mode characteristic values comprise:
        inputting the original compensation values to each of the prediction mode sub-models, and performing the numerical processing to obtain the plurality of mode characteristic values having a one-to-one relationship with the prediction mode sub-models.

6. The method of claim 1, wherein the performing the mode selection according to the reconstructed value set and the syntactic element code set to obtain the optimal prediction mode comprises:
    performing the mode selection according to the reconstructed value set and the syntactic element code set to obtain preferred prediction modes and preferred syntactic element codes corresponding to the preferred prediction modes; and
    performing a code rate judgment on the preferred syntactic element codes in sequence to obtain the optimal prediction mode.

7. The method of claim 6, wherein the syntactic element code is configured to represent a residual transformation mode and an interpolation type.

8. The method of claim 6, wherein the performing the code rate judgment on the preferred syntactic element codes in sequence to obtain the optimal prediction mode comprises:
    selecting a syntactic element code from the preferred syntactic element codes according to code rates in a descending order and using the selected syntactic element code as a current syntactic element code; and
    using a prediction mode corresponding to the current syntactic element code as the optimal prediction mode, if a bit number of the current syntactic element code does not exceed a preset bit number.

9. The method of claim 8, further comprising:
    abandoning the current syntactic element code, if the bit number of the current syntactic element code exceeds the preset bit number; and
    selecting a next syntactic element code according to the descending order of the code rates to perform the code rate judgment until the optimal prediction mode is obtained.

10. The method of claim 1, wherein the spatial domain sampling model is an algorithm or a model for performing the down-sampling at a pixel level, and the prediction mode overall model is a model of predicting original compensation values by using a numerical coding method.

11. The method of claim 1, wherein a syntactic element is information required for a decoder to reconstruct Demura compensation values.

12. A computer apparatus, comprising a memory and a processor, wherein, a computer program is stored in the memory, and the processor, when executing the computer program, performs steps of the method of claim 1.

13. A non-transitory computer readable storage medium, having a computer program stored thereon, wherein, the computer program, when executed by a processor, causes the processor to perform steps of the method of claim 1.

14. A computer program product, comprising a computer program, wherein, the computer program, when executed by a processor, causes the processor to perform steps of the method of claim 1.

15. A system for compressing Demura compensation value, comprising:
- a data acquiring circuit, configured to acquire original compensation values of a target panel;
- a spatial sampling circuit, configured to input the original compensation values into a spatial domain sampling model and perform a down-sampling to obtain spatial domain sampling values;
- a prediction mode circuit, configured to input the original compensation values into a prediction mode overall model and perform a numerical processing to obtain a plurality of mode characteristic values;
- a data reconstructing circuit, configured to perform a data reconstruction on the spatial sampling values and the plurality of mode characteristic values to obtain a reconstructed value set after the data reconstruction;
- a syntactic element coding circuit, configured to perform a syntactic encoding on the spatial sampling values and the plurality of mode characteristic values to obtain a syntactic element code set;
- an optimal prediction mode selecting circuit, configured to perform a mode selection according to the reconstructed value set and the syntactic element code set to obtain an optimal prediction mode; and
- a compensation value compression code outputting circuit, configured to acquire and output a syntactic element code corresponding to the optimal prediction mode to obtain a Demura compensation value compression code.

* * * * *